United States Patent [19]
Mukhanov

[11] Patent Number: 5,365,476
[45] Date of Patent: Nov. 15, 1994

[54] THREE-PORT JOSEPHSON MEMORY CELL FOR SUPERCONDUCTING DIGITAL COMPUTER

[75] Inventor: Oleg A. Mukhanov, Rye Brook, N.Y.

[73] Assignee: Digital Equipment Corporation, Maynard, Mass.

[21] Appl. No.: 23,276

[22] Filed: Feb. 26, 1993

[51] Int. Cl.[5] .......................................... G11C 11/44
[52] U.S. Cl. ................... 365/162; 365/160; 327/186; 327/527; 326/3
[58] Field of Search ...................... 365/160, 161, 162; 307/476, 462, 306, 245

[56] References Cited

U.S. PATENT DOCUMENTS

| | | | |
|---|---|---|---|
| 4,509,146 | 4/1985 | Wang et al. | 365/162 |
| 4,974,205 | 11/1990 | Kotani | 365/162 |
| 5,229,962 | 7/1993 | Yuh et al. | 365/162 |
| 5,253,199 | 10/1993 | Gibson | 365/162 |

OTHER PUBLICATIONS

G. L. Chiu, Three State Superconductive NDRO Memory Cell, IBM Technical Disclosure Bulletin, vol. 27, No. 1B, pp. 806–809, Jun. 1984.
Perng–Fei Yuh, "A Wide–Margin, Multiple Fan–In NOR Gate for Josephson Decoder," Hypres, Inc. 175 Clearbook Rd, Elmsford, N.Y., pp. 1–4.
Perng–Fei Yuh et al., "A Buffered Nondestructive–Readout Josephson Memory Cell with Three Gates," *IEEE Trans. on Magnetics*, vol. 27, No. 2, New York (Mar. 1991), pp. 2876–2878.
S. Tahara et al., "4–Kbit Josephson Nondestructive Read–out RAM Operated at 500 psec and 6.7 mW," *IEEE Trans. on Magnetics*, vol. 27, No. 2, New York (Mar. 1991), pp. 2626–2633.
Seigo Kotani et al., "A Subnanosecond Clock Josephson 4–bit Processor," *IEEE J. of Solid–State Circuits*, vol. 25, No. 1, New York, Feb. 1990, pp. 117–124.
Shuichi Nagasawaa et al., "570–ps 13–mW Josephson 1–kbit NDRO RAM," *IEEE J. of Solid–State Circuits*, vol. 24, No. 5, New York, Oct. 1989, pp. 1363–1371.
Joshifusa Wada, "Josephson Memory Technology," Proceedings of the IEEE, vol. 77, No. 8, (Aug. 1989), New York, pp. 1194–1207.
Itaru Kurosawa et al., "A 1–bit Josephson Random Access Memory Using Variable Threshold Cells," *IEEE J. of Solid–State Circuit*, vol. 24, No. 4 (Aug. 1989), New York, pp. 1034–1039.
Norio Fujimaki, "Josephson Modified Variable Threshold Logic Gates for Use in Ultra–High–Speed LSI," *IEEE Trans. on Electron Devices*, vol. 36, No. 2 (Feb. 1989), New York, pp. 433–446.
Juri Matisoo, "The Superconducting Computer," *Scientific American* (May 1980), New York, pp. 50–65.
S. M. Faris et al., "Basic Design of a Josephson Technology Cache Memory," IBM J. Res. Development, vol. 24, No. 2 (Mar. 1980), pp. 143–154.
Walter H. Henkels, "Experimental Single Flux Quantum NDRO Josephson Memory Cell," *IEEE J. of Solid–State Circuits*, vol. SC–14, No. 5 (Oct. 1979), New York, pp. 794–796.

Primary Examiner—Eugene R. LaRoche
Assistant Examiner—Son Dinh
Attorney, Agent, or Firm—Ronald C. Hudgens; Robert J. Feltovic; Albert P. Cefalo

[57] ABSTRACT

A three-port Josephson memory cell has one input port (a data line) and two output ports (first and second sense lines). The memory cell receives a write enable pulse on a write line to store a bit of data from the data line as circulating supercurrent. The memory cell also receives a first read enable pulse on a first read line to enable assertion of the stored data onto the first sense line, and receives a second read enable pulse on a second read line to enable assertion of the stored data onto the second sense line. To provide non-destructive readout and wide margins, the memory cell includes a write gate responsive to the write enable pulse for storing current from the data line, a first read gate responsive to the stored current and the first read enable pulse, a second read gate responsive to the stored current and the second read enable pulse, a first buffer gate responsive to the first read gate for asserting a data output signal on the first sense line, and a second buffer gate responsive to the second read gate for asserting a data output signal on the second sense line. In the preferred construction, the current is stored in two storage loops. One storage loop includes a control current path for the first read gate, and the other storage loop includes the control current path for the second read gate.

19 Claims, 10 Drawing Sheets

THREE-PORT JOSEPHSON MEMORY CELL FOR SUPERCONDUCTING DIGITAL COMPUTER

BACKGROUND OF THE INVENTION

1. Field of the Invention

The present invention relates to a superconducting digital computer, and more particularly to a Josephson memory cell. Specifically, the invention relates to a three-port Josephson memory cell having one input port and two output ports.

2. Background of the Invention

High-speed digital computers currently employ transistor logic and memory circuits. Advances in photolithographic techniques have permitted the size of the transistor logic circuits to be shrunk to a sufficiently small size that the size of the circuits is now limited by power dissipation. Therefore, alternative computing technologies are being investigated that offer a substantial improvement in the "speed-power" product of a logic gate.

One promising computing technology is based on the ability of a superconducting and tunneling junction, known as a "Josephson junction", to switch from a superconducting state to a resistive state. A Josephson junction can change state in as little as six picoseconds. A logic gate employing a Josephson junction can consume no more than a few microwatts. Moreover, a memory cell employing a Josephson junction can store data represented by a quantized circulating supercurrent, and the data can be stored indefinitely without any power consumption.

Josephson technology has improved considerably over the last few years due to the development of niobium multilayer planarization technology. Refractory materials are used for all layers of a Josephson integrated circuit in order to enhance stability. The Josephson junction consists of six nanometers of aluminum oxide between niobium metal layers. Resistors are provided by an 80 nanometer layer of molybdenum. The processing steps are similar to the metallization steps during the manufacture of conventional silicon integrated circuits, although processing temperatures should be maintained below 160° celsius to prevent damage to the Josephson junction. Further details on the niobium multilayer planarization process and the construction of Josephson logic gates and memory cells is found in Fujimaki, "Josephson Modified Variable Threshold Logic Gates for Use in Ultra-High-Speed LSI," *IEEE Transactions on Electron Devices*, Vol. 36, No. 2, February 1989, IEEE, New York, N.Y., pp. 433–446; Yoshifusa Wada, "Josephson Memory Technology," *Proceedings of the IEEE*, Vol. 77, No. 8, August 1989, IEEE, New York, N.Y., pp. 1194–1207; Nagasawa et al., "570-ps 13-mW Josephson 1-k bit NDRO RAM," *IEEE Journal of Solid-State Circuits*, Vol. 24, No. 5, October 1989, IEEE, New York, N.Y., pp. 1363–1371; and Kotani et al., "A Subnanosecond Clock Josephson 4-bit Processor," *IEEE Journal of Solid-State Circuits*, Vol 25, No. 1, February 1990, IEEE, New York, N.Y., pp. 117–124, which are all incorporated herein by reference.

One limitation of Josephson technology is reduced operating margins in comparison to transistor technology. A transistor logic gate is typically a voltage-controlled device that has a wide operating margin. The input threshold voltage for a transistor logic gate, for example, is not expected to vary by more than a few percent of the power supply voltage. In contrast, a Josephson gate is a current-controlled device, and the threshold of the Josephson gate is proportional to the "critical current" of the Josephson junction. The "critical current" of the Josephson junction is an exponential function of the width of the junction. Consequently, the threshold of the Josephson gate is highly sensitive to process parameters affecting the width of the Josephson junction.

At present, operating margins limit the yield of Josephson memory chips. Typically, a Josephson memory cell has a flux storage loop including a "write gate" that is opened during a write operation to change the flux in the loop. The Josephson memory cell also has a sense gate that is responsive to the stored flux during a read operation. The two gates ensure a non-destructive readout of the data stored in the cell. Such a two-gate memory cell has low operating margins due to a "half select" problem. The half-select problem refers to the fact that a cell in an array is selected by coincidentally applying currents in a row and a column. While the cell to be selected senses two units of current, all the other cells in that particular row and column will sense one unit of current and become half-selected.

One approach to increasing the operating margin of a Josephson memory cell is to add a buffer gate to the cell. It is also possible to solve the half-select problem by adding only a single buffer gate, as described in Perng-Fei Yuh, "A buffered Nondestructive-Readout Josephson Memory Cell With Three Gates," *IEEE Transactions on Magnetics*, Vol. 27, No. 2, March 1991, IEEE, New York, N.Y., pp 2876–2878.

It is believed that a reduced instruction set architecture (RISC) is preferred for a Josephson digital computer, because a large and fast machine could be constructed from a small number of different kinds of moderately complex chips. It is further believed that a dual read port/single write port register file would be an important component of such a RISC computer. Such a dual read port/single write port register file would permit simultaneous and independent access to two register source operands. A large register file would reduce the frequency of cache access cycles, and a dual read port would save cycles otherwise required for register fetch operations if the register file were to have only a single read port.

All known Josephson memory cells have only one port for read-out. A dual read port/single write port register file could be made of such cells by fabricating two identical single read port/single write port memory arrays, and connecting in parallel the write address and the write data input ports of the two arrays. Such a construction, however, would require twice the area and power consumption of a single read port/single write port register file.

SUMMARY OF THE INVENTION

Accordingly, the basic object of the invention is to provide a dual nondestructive readout Josephson memory cell with a single write gate and two independent read gates responsive to respective first and second read enable signals and providing respective first and second data outputs on independent first and second sense lines.

A specific object of the invention is to provide such a dual nondestructive readout Josephson memory cell that provides buffered first and second data outputs on the independent first and second sense lines but uses no more than five gates in the cell.

In accordance with a basic aspect of the present invention, there is provided a method of storing data in a superconducting memory cell and retrieving the stored data, said memory cell receiving a data input signal from a data line, a write enable signal from a write line, a first read enable signal from a first read line, and a second read enable signal from a second read line, said memory cell transmitting a first data output signal to a first sense line and a second data output signal to a second sense line. The method comprises the steps of: opening a write gate in response to said write enable signal being received from said write line to divert and store said data input signal as a circulating current in said memory cell; sensing said circulating current with a first read gate to generate said first data output signal, and transmitting said first data output signal from said memory cell to said first sense line in response to said first read enable signal; and sensing said circulating current with a second read gate to generate said second data output signal, and transmitting said second data output signal from said memory cell to said second sense line in response to said second read enable signal.

In accordance with another aspect, the present invention provides a superconducting memory cell receiving a data input signal from a data line, a write enable signal from a write line, a first read enable signal from a first read line, and a second read enable signal from a second read line, said memory cell transmitting a first data output signal to a first sense line and a second data output signal to a second sense line. The memory cell comprises a plurality of Josephson gates. The Josephson gates include a write gate having a control current path connected to said write line for receiving said write enable signal, and a gated current path connected to said data line for receiving said data input signal and storing said data input signal as circulating current in response to said write enable signal; a first read gate having a control current path connected to the gated current path of said write gate for sensing said circulating current to generate said first data output signal, said first read gate having a gated current path connected to said first read line and said first sense line for transmitting said first data output signal from said memory cell to said first sense line in response to said first read enable signal; and a second read gate having a control current path connected to the gated current path of said write gate for sensing said circulating current, said second read gate being connected to said second read line and said second sense line for transmitting said second data signal from said memory cell to said second sense line in response to said second read enable signal.

In accordance with another aspect, the present invention provides a fully buffered three-port superconducting memory cell. The memory cell receives a data input signal from a data line, a write enable signal from a write line, a first read enable signal from a first read line, and a second read enable signal from a second read line, said memory cell transmitting a first data output signal to a first sense line and a second data output signal to a second sense line. The memory cell comprises a plurality of Josephson gates. The Josephson gates include: a write gate having a control current path connected to said write line for receiving said write enable signal, and a gated current path connected to said data line for receiving said data input signal and storing said data input signal as circulating current in response to said write enable signal; a first read gate having a control current path connected to the gated current path of said write gate for sensing said circulating current, said first read gate having a gated current path connected to said first read line for receiving said first read enable signal and diverting said first read enable signal when said circulating current is present; a first buffer gate having a control current path connected to the gated current path of said first read gate for receiving said first read enable signal diverted from said gated current path of said first read gate when said circulating current is present, said first buffer gate having a gated current path connected to said first sense line for transmitting said first data output signal from said memory cell to said first sense line when said first read enable signal is diverted from said gated current path of said first read gate; a second read gate having a control current path connected to the gated current path of said write gate for sensing said circulating current, said second read gate having a gated current path connected to said second read line for receiving said second read enable signal and diverting said second read enable signal when said circulating current is present; and a second buffer gate having a control current path connected to the gated current path of said second read gate for receiving said second read enable signal diverted from said gated current path of said second read gate when said circulating current is present, said second buffer gate having a gated current path connected to said second sense line for transmitting said second data output signal from said memory cell to said second sense line when said second read enable signal is diverted from said gated current path of said second read gate.

BRIEF DESCRIPTION OF THE DRAWINGS

Other objects and advantages of the invention will become apparent upon reading the following detailed description and upon reference to the drawings, in which.

While the invention will be described in connection with a preferred embodiment, it will be understood that it is not intended to limit the invention to the preferred embodiment. On the contrary, it is intended to cover all modifications, alternatives, and equivalent arrangements as may be included within the scope of the invention as defined by the appended claims.

DETAILED DESCRIPTION OF THE DRAWINGS

Figure 1:
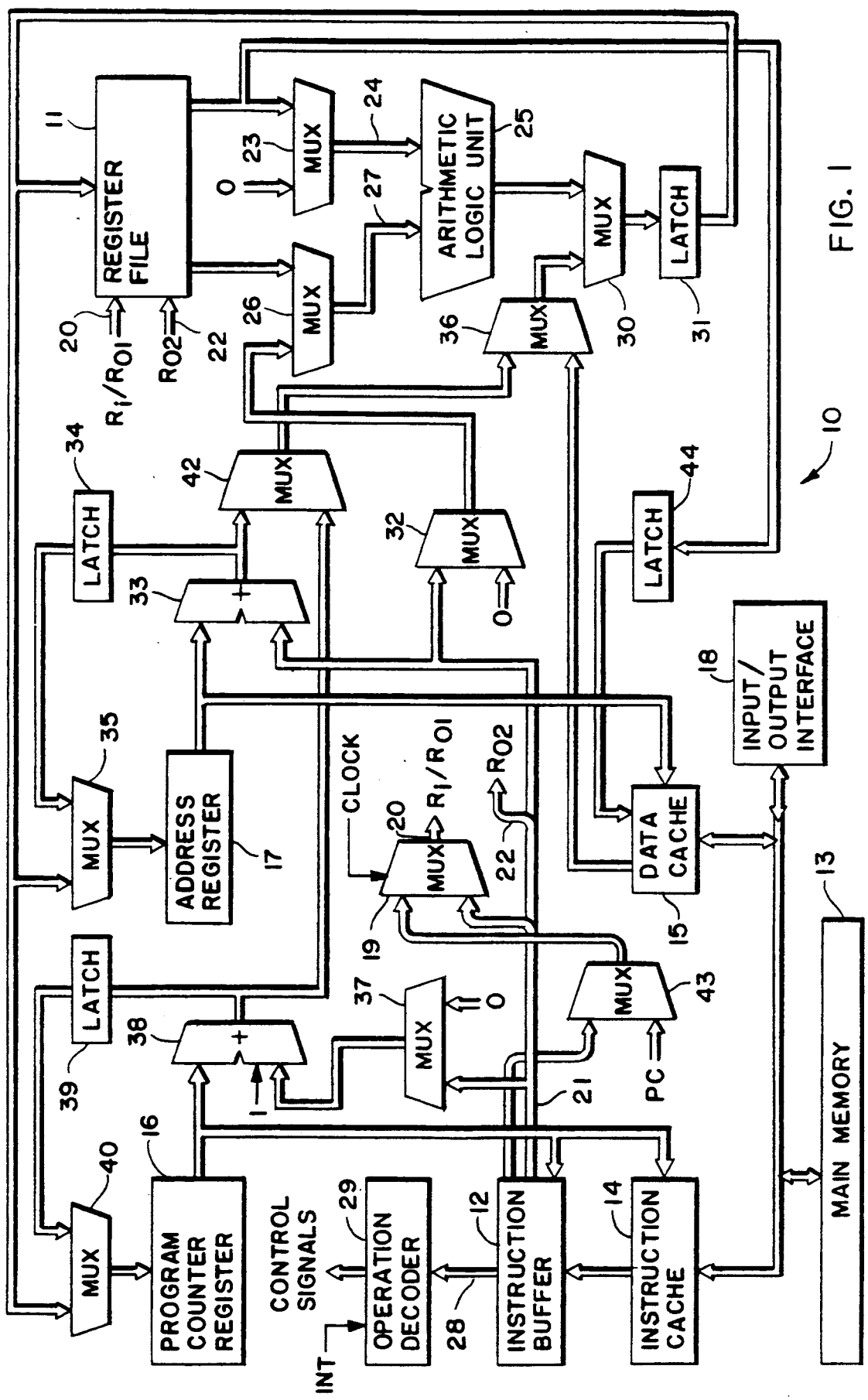
FIG. 1 is a functional block diagram of a RISC computer having a register file including the three-port memory cells according to the present invention.

Turning now to FIG. 1, there is shown a functional block diagram of a RISC computer generally designated 10, which has a register file 11 made of three-port memory cells in accordance with the present invention. The RISC computer 10 recognizes a "reduced" instruction set having a limited number of different kinds of instructions. All of the instructions, for example, have the same length, and all of the instructions have similar information in fixed fields. Therefore, a minimal amount of logic is required for decoding the information specified by a current instruction, which is held in an instruction buffer 12. The first field, for example, is an operation code, the second field is a register specifier, the third field is a register source specifier, and the fourth field is a register source specifier. Alternatively, the fourth field is a short literal. Alternatively, the third and fourth fields specify an address displacement. These various specifiers will be further described below with respect to the specific circuitry shown in FIG. 1.

Josephson memory cells can be constructed in various ways to provide either high-speed memory requiring relatively large and complex cells, or relatively slow memory comprising relatively small and simple cells. Therefore, in a Josephson superconducting computer, it is highly desirable to use a memory hierarchy. As shown in FIG. 1, the memory hierarchy includes a relatively large capacity main memory 13 made of relatively slow and simple cells, an instruction cache 14 made of relatively fast and complex memory cells, and a data cache 15 also made of relatively fast and complex memory cells. The instruction cache 14 is addressed by a program counter 16 for loading instructions into the instruction buffer 12. The data cache 15 is addressed by an address register 17 for either fetching data to be processed, or storing data having been processed. Initial data to be processed by the processor 10 is loaded into the main memory 13 through an input/output interface 18, and the final results of the data processing are transmitted from the main memory 13 through the input/output interface 18.

A significant advantage of the RISC processor 10 shown in FIG. 1 is that the RISC processor 10 can execute, in a single processor cycle, an inter-register operation including two independently-specified source registers, and an independently-specified destination register. The instruction for such an inter-register operation has the format (OP, $R_i$, $R_{01}$, $R_{02}$). To execute such an instruction, the register source operands in registers $R_{01}$ and $R_{02}$ are simultaneously fetched from the register file 11 in a beginning portion of the processor cycle. In this beginning portion of the processor cycle, a multiplexer 19 selects the second register specifier $R_{01}$ from the current instruction in the instruction buffer 12, and transmits the selected register specifier to a first address input 20 of the register file 11. The third register specifier $R_{02}$ is simply obtained from a fixed portion of a bus 21 from the instruction buffer 12, and the third register specifier is applied to a second address input 22 of the register file 11. The first register source operand from register $R_{01}$ is read from the register file and passed through a multiplexer 23 to a first input 24 of an arithmetic logic unit 25. In a similar fashion, the second register source operand from register $R_{02}$ is read from the register file 11, passed through a multiplexer 26, and applied to a second input 27 of the arithmetic logic unit 25.

The arithmetic logic unit 25 performs an arithmetic or logical operation specified by the operation code (OP) of the instruction. The operation code appears on a bus 28 from the instruction buffer 12, and the operation code is decoded by an operation decoder 29 to provide control signals to the arithmetic logic unit 25 and other components in the processor 10 such as the multiplexers 23, 26. The result of the arithmetic or logical operation is selected by a multiplexer 30 and received in a latch 31. During a final portion of the processor cycle, the latch 31 holds the result to be written to the destination register $R_i$ in the register file 11. During this final portion of the processor cycle, the multiplexer 19 and a multiplexer 43 select the destination register specifier $R_i$ and apply the destination specifier $R_i$ to the first address input 20 to the register file 11. Therefore, the result is written from the latch 31 into the specified destination register $R_i$ in the register file 11.

The processor 10 recognizes an instruction having the format (OP, $R_i$, $R_{01}$, SL) in order to perform an operation between a source register operand $R_{01}$ and a short literal SL, and to store the result in a destination register $R_i$. Such an operation is similar to the inter-register operation just described, except that the operation decoder 29 controls the multiplexer 26 and a multiplexer 32 to select the short literal from the bus 21 from the instruction buffer 12 and to apply the selected short literal to the second input 27 of the arithmetic logic unit 25. In still another similar instruction, the multiplexer 23 selects a value of zero so that the arithmetic logic unit 25 passes the short literal SL to the latch 31, and therefore the short literal SL is stored in the destination register $R_i$.

An instruction having the form (OP, $R_{01}$, DISP) stores the contents of the source register $R_{01}$ to memory at the address specified by the address register 17, and increments the address register 17 by the specified displacement. In this case, the contents of the source register $R_{01}$ are read from the register file 11 in a beginning portion of the processor cycle, and latched in a latch 44 for writing into the data cache 15. Moreover, an adder 33 adds the address in the address register 17 to the displacement (DISP) on the bus 21, and a latch 34 receives the output of the adder 33. In the final portion of the processor cycle, the result held in the latch 34 is selected by a multiplexer 35 and loaded into the address register 17.

To load a specified register with data from the cache, an instruction has the format (OP, $R_i$, DISP). In this case, the data cache 15 is read at the address location specified by the address register 17, and the data are passed through a multiplexer 36 and through the multiplexer 30 and loaded into the latch 31 during a first portion of the processor cycle. During the final portion of the processor cycle, the result from the latch 31 is stored in the specified destination register $R_i$ in the register file 11. Also during the final portion of the processor cycle, the address register 17 is loaded with the incremented address from the latch 34.

Usually, the address in the program counter register 16 is incremented by one during the execution of each instruction, so that instructions in the instruction buffer 12 are executed in sequence. In this case, a multiplexer 37 selects a value of zero, and an adder 38 adds a carry-in of one to the value of the program counter register 16. The sum is received in a latch 39. During a final portion of the processor cycle, the sum in the latch 39 is selected by a multiplexer 40 and loaded into the program counter register 16.

For certain instructions called branch instructions, however, the address in the program counter register is advanced by one plus a specified displacement value. A branch instruction, for example, has the format (OP, $R_{01}$, DISP). The branch could be conditional, for example, depending upon a test of the contents of the register $R_{01}$ or depending upon the status of a previous computation by the arithmetic logic unit 25. To compute the branch target address, the multiplexer 37 selects the displacement from the bus 21. The adder 38 then adds the displacement to the value of the program counter register 16 plus a carry-in of one to obtain the branch target address, and the branch target address is stored in the latch 39. During the final portion of the processor cycle, if the branch is to be taken, the target address in the latch 39 is selected by a multiplexer 40 and loaded into the program counter 16.

In order for instruction execution to jump to a specified program location, the program counter register 16 is loaded with a value computed by the arithmetic logic unit 25. Therefore, the operation decoder 29 recognizes an opcode for storing a computed value in the program counter register. In this case, the result of the computation, which is received in the latch 31, is selected by the multiplexer 40 and loaded into the program counter register 16.

Prior to a branch or jump to a subroutine, it is necessary to save a return address in the register file 11. Therefore, the processor 10 recognizes an instruction of the form (OP, $R_i$, DISP), in which the value of the program counter register, added by the adder 37 to one plus the displacement, is stored in the destination register $R_i$. In this case, a multiplexer 42 selects the sum from the adder 38, the multiplexer 36 selects the output of the multiplexer 42, and the multiplexer 30 selects the output of the multiplexer 36 and loads the result in the latch 31. In the final portion of the processor cycle, the result in the latch 31 is loaded into the destination register $R_i$ in the register file 11.

To save the contents of the address register 17, the processor 10 recognizes an instruction in the form (OP, $R_i$, DISP), in which the sum of the contents of the address register 17 and the displacement DISP are stored in the destination register $R_i$. In this case, the multiplexer 42 selects the sum from the adder 33, the multiplexer 36 selects the sum from the multiplexer 42, and the multiplexer 30 selects the sum from the multiplexer 36 and stores the sum in the latch 31. In the final portion of the processor cycle, the sum in the latch 31 is stored in the specified destination register $R_i$ in the register file 11.

Finally, it is desirable for the processor 10 to recognize an interrupt. In this case, it is necessary for the operation decoder 29 to respond to an interrupt signal INT by ignoring the operation code of the next instruction. Instead of decoding the operation code of the next instruction, the operation decoder generates control signals for the next processor cycle that will save the contents of the program counter register in a reserved register file register (PC). In response to these control signals, the multiplexer 37 selects a value of zero, the multiplexer 42 selects the sum from the adder 38, the multiplexer 36 selects the sum from the multiplexer 42, the multiplexer 30 selects the sum from the multiplexer 36, and the output of the multiplexer 30 is stored in the latch 31. In a final portion of the processor cycle, the multiplexer 43 selects the destination register address PC, the multiplexer 19 selects the output of the multiplexer 43, and the sum in the latch 31 is stored in the destination register PC in the register file 11. In the next processor cycle, the operation decoder 29 loads the program counter to a value of zero computed by controlling the multiplexer 32 to select a value of zero, the multiplexer 26 to select the value of zero from the multiplexer 32, and the multiplexer 23 to select a value of zero. The arithmetic logic unit 25 performs an arithmetic or logical operation giving a computed result of zero, which is held in the latch 31 while being loaded into the program counter register 16. The operation decoder 28 then begins decoding instructions of an interrupt handler routine beginning at an instruction address of zero. The interrupt handler, for example, saves the address register 17 in another reserved register in the register file, loads the address register 17 with a stack address from another reserved register in the register file 11, pushes the contents of the registers in the register file on the stack in memory, and then loads the program counter register 16 with an interrupt vector read from data memory.

The hardware organization of the processor 10 in FIG. 1 minimizes the complexity of the control logic, so that the processor 10 may be constructed of only a few different kinds of moderately complex integrated circuit chips. Yet the processor 10 may be very large and powerful, because the instructions and registers could contain a large number of bits, for example, thirty-two bit instructions and sixty-four bit registers. Many chips of the processor could contain a "bit slice" of a number of registers, multiplexers, and data paths; for example, each chip could contain an eight-bit field of the registers, multiplexers, and data paths in the processor.

It should be appreciated that many of the instructions executed by the processor 10 will be inter-register instructions requiring the simultaneous reading of a first source register $R_{01}$ and a second source register $R_{02}$ during a first portion of the processor cycle, and the storing of a result in a destination register $R_i$ during the final portion of the processor cycle. Moreover, the register file 11 should be rather large in order to reduce the number of cache access cycles to the data cache 15. Therefore, the construction of the register file 11 is important to the performance of a Josephson superconducting computer having a RISC architecture.

Figure 2:
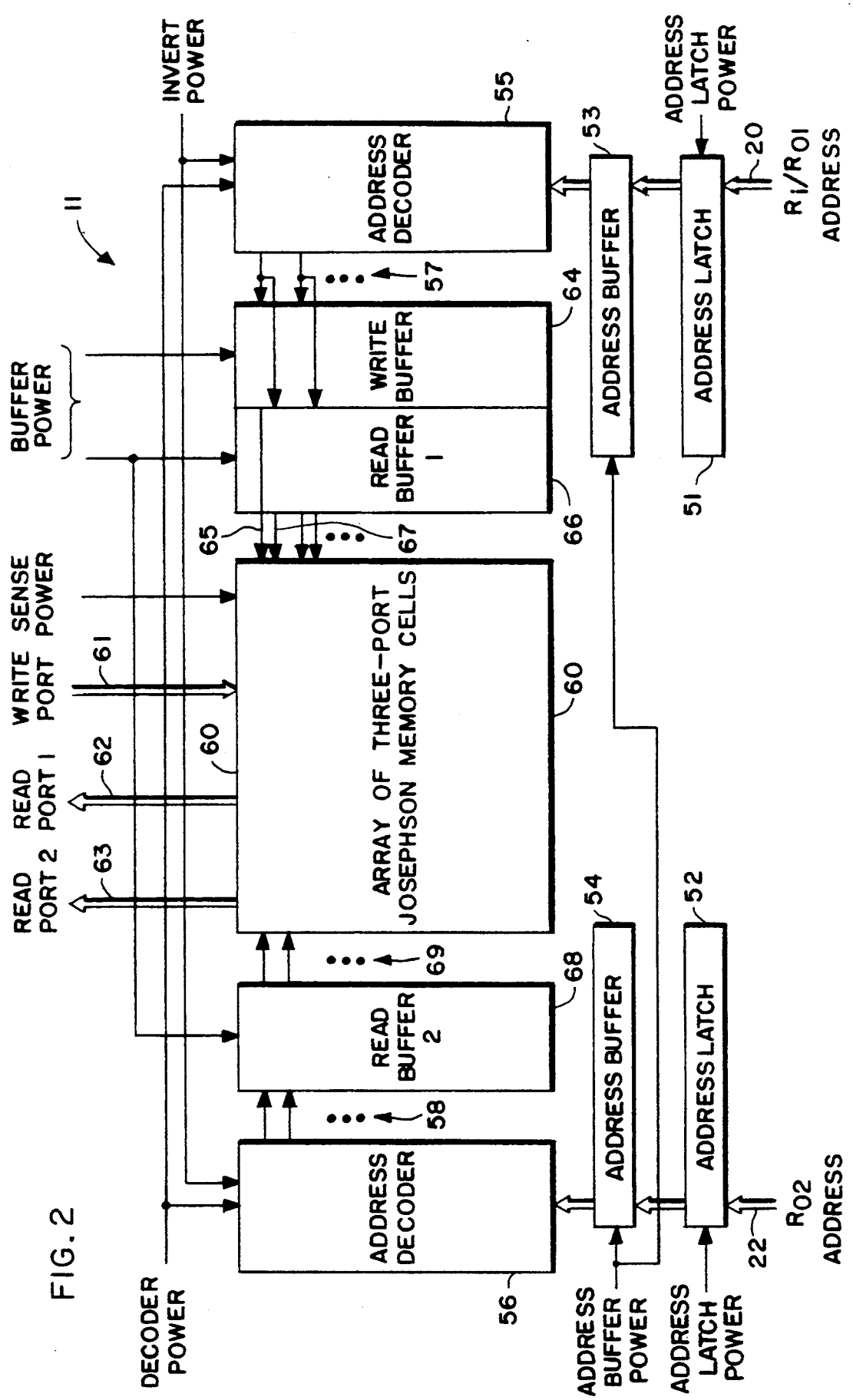
FIG. 2 is a block diagram of the register file shown in FIG. 1.

Turning now to FIG. 2, there is shown a block diagram of the register file 11 introduced in FIG. 1. The address $R_i/R_{01}$ on the input 20 is received in an address latch 51, and the address $R_{02}$ on the input 22 is received in an address latch 52. The latches 51, 52 generate true and complement address signals. The address signals from the latch 51 are buffered by an address buffer 53, and the address signals from the latch 52 are buffered in an address buffer 54. The buffers 53, 54 drive a large number of logic gates in respective address decoders 55, 56. Preferred circuitry for the latches 51, 52 and buffers 53, 54 is described below with reference to FIG. 13.

The decoder 55 has one output line 57 for each distinct register address received on the address input 20. After the latch 51, buffer 53, and decoder 55 are sequentially powered up, the decoder 55 drives a current into a respective one of the output lines 57 specified by the address on the address input 20. In a similar fashion, the decoder 56 has one output line 58 for each distinct register address received on the address input 22, and the decoder 56 drives a current into a respective one of the address lines 58 specified by the address on the input 22.

The register file 11 includes an array of three-port Josephson memory cells 60 in accordance with the present invention. The array includes a row of cells for each register in the register file. Data is written from a write port 61 into the addressed register $R_i$. Data is read from an addressed register $R_{01}$ in the array 60 and transmitted to a first read port 62. Data is simultaneously read from an independently addressed register $R_{02}$ in the array 60 and transmitted to a second read port 63.

For selecting the register to receive data from the write port 61, the register file 11 has a write buffer 64 that receives the address lines 57 and drives a selected write line such as the write line 65 for the first row of memory cells in the array 60. The write buffer 64 is powered up at the final portion of the processor cycle when data is to be written into the register file 11.

To read data from the address register $R_{01}$, the register file 11 includes a first read buffer 66 which also receives the output lines 57 from the decoder 55 to drive a selected read line from the first read buffer to a row of memory cells, such as the read line 67 to the first row of memory cells in the array 60. Data are read from the row of memory cells selected by the first read buffer 66 and asserted on the first read port 62. In a similar fashion, the register file 11 includes a second read buffer 68 that receives the output lines 58 from the decoder 56 and drives a selected one of the read lines 69 from the second read buffer to the rows of memory cells in the array 60. Data are read from the row of memory cells selected by the second read buffer 68 and asserted on the second read port 63.

The three-port Josephson memory cells of the present invention are constructed from Josephson gates. A Josephson gate may have various forms of construction, which determines to a degree the size of the gate and the gate's operating margins. In general, however, a Josephson gate is a current-controlled device, and therefore various particular forms of construction will be represented by the generic symbol shown in FIG. 3A.

Figure 3A:
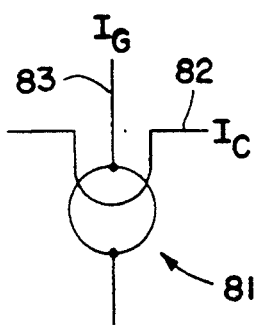
FIG. 3A is a symbol for a Josephson gate.
Figure 3B:
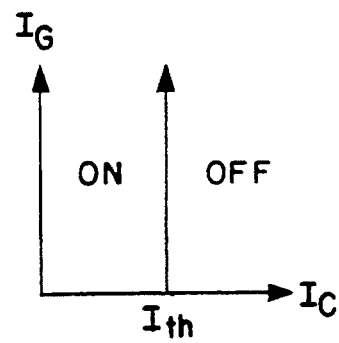
FIG. 3B is a graph of an ideal switching characteristic for a Josephson gate.

As shown in FIG. 3A, a Josephson gate 81 has a path 82 for a control current $I_c$, and a path 83 for a gated current $I_G$. The ideal switching characteristic of a Josephson gate is shown in FIG. 3B, although it should be noted that such an ideal switching characteristic is not obtained in practice. In the ideal case, the path 83 for the gated current $I_G$ either presents no resistance to the flow of the gated current, or presents an infinite resistance to the flow of the gated current. In other words, the path 83 for the gated current $I_G$ has either an "on" or an "off" state. In the ideal case, the path 83 is in its "on" state so long as the control current $I_c$ is less than a predetermined threshold current $I_{th}$, and the path 83 is in its "off" state whenever the control current $I_c$ exceeds the threshold current $I_{th}$.

Figure 4A:
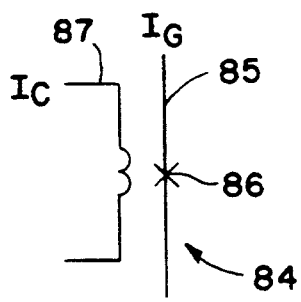
FIG. 4A is a schematic diagram of a Josephson gate including a single tunneling junction.

Turning now to FIG. 4A, there is shown one form of construction for a Josephson gate. In this case, the path 85 for the gated current $I_G$ includes a superconducting and tunneling junction 86, represented by a "X" in the path 85. The superconducting and tunneling junction 86 is known as a "Josephson junction". The Josephson junction has an "on" state presenting virtually no resistance to the flow of current through the path 85 and across the junction 86. The Josephson junction 86 also has an "off" state presenting a relatively high resistance to the flow of current along the path 85 and through the junction 86. The transition between the "on" state and the "off" state of the Josephson junction 86 is a function of the magnetic flux in the junction 86. The magnetic flux in the junction 86 is controlled by the control current $I_c$ flowing through a control path 87.

Figure 4B:
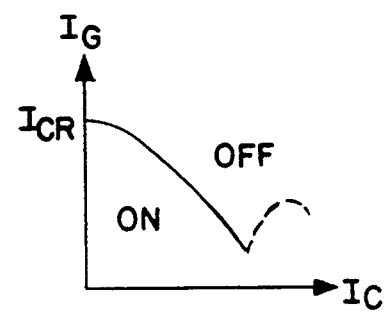
FIG. 4B is a graph of the switching characteristic of the Josephson gate shown in FIG. 4A.

Turning now to FIG. 4B, there is shown the switching characteristic for the Josephson gate 84 shown in FIG. 4A. As shown in FIG. 4B, the state of the gate 84 is a function of the gated current $I_G$ as well as the control current $I_c$. When the control current $I_c$ is zero, the gate 84 switches from its "on" state to its "off" state when the gated current $I_G$ exceeds a predetermined critical current ICR. Moreover, the switching characteristic is a sinusoidal function of the control current $I_c$. Therefore the switching characteristic shown in FIG. 4B deviates greatly from the ideal switching characteristic shown in FIG. 3B. The switching characteristic of the Josephson gate 84 in FIG. 4A also exhibits a hysteresis or latching property. When the gate 84 is initially in its "on" state, the switching characteristic is as shown in FIG. 4B. When the gate 84 switches to its "off" state, the gated current $I_G$ must be reduced significantly for the gate to switch back to its "on" state. This hysteresis or latching property is used advantageously in synchronous logic circuitry by powering Josephson gates with pulses or multiple phases of alternating current.

To obtain a more ideal switching characteristic, a Josephson gate may include two or more Josephson junctions. Shown in FIG. 5A, for example, is a schematic diagram of a Josephson gate 91 having a first Josephson junction 92 and a second Josephson junction 93. The gated current path 94 of the gate 91 is split between the two junctions 92 and 93, so that the two junctions 92, 93 are connected to each other in a loop circuit 95.

Figure 5A:
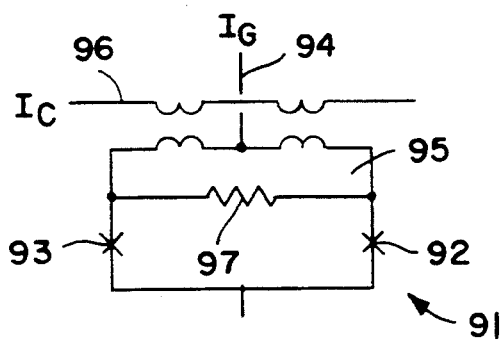
FIG. 5A is a schematic diagram of a Josephson gate having a pair of tunneling junctions.
Figure 5B:
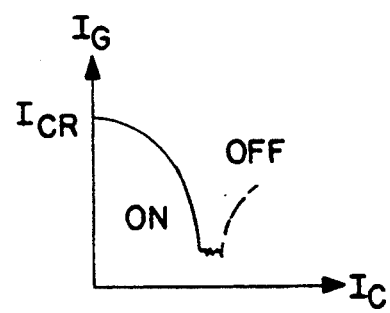
FIG. 5B is a graph of the switching characteristic of the Josephson gate shown in FIG. 5A.

One advantage to the more complicated gate 91 of FIG. 5A over the gate 84 of FIG. 4A is that the switching characteristic of the gate 91 is a function of the magnetic flux threading the loop 95 and generated by the control current $I_c$ flowing through a control path 96. The switching characteristic, as shown in FIG. 5B, is therefore a more sensitive function of the control current $I_c$. Moreover, as shown in FIG. 5A, a resistor 97 can be placed across the loop circuit 95 in order to improve the switching characteristics of the gate 91 by damping the loop circuit from a resonance condition caused by the inductance and capacitance of the loop circuit.

Figure 6A:
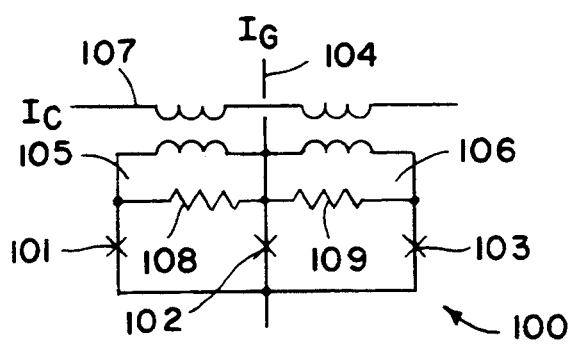
FIG. 6A is a schematic diagram of a Josephson gate having three tunneling junctions.
Figure 6B:
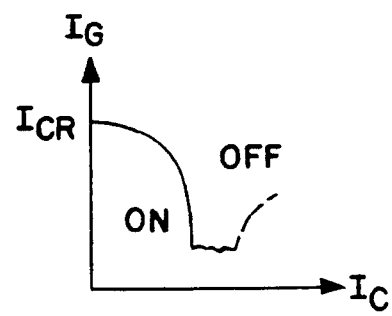
FIG. 6B is a graph of the switching characteristic of the Josephson gate shown in FIG. 6A.

From a theoretical standpoint, the switching characteristics shown in FIGS. 4B and 5B resemble interference patterns that are presumed to result from the interference of electron wave functions of superconducting pairs of electrons in the Josephson gates. The characteristic curve as shown in FIG. 4B resembles the interference pattern due to the diffraction of a wave passing through a single slit, and the switching characteristic shown in FIG. 5B resembles the interference pattern of a wave passing through a spaced pair of slits. This analogy has led Josephson logic designers to construct Josephson gates having three or more Josephson junctions, in order to obtain a more discriminating switching characteristic. As shown in FIG. 6A, for example, a Josephson gate 100 includes three Josephson junctions 101, 102, and 103. The gated current along a path 104 is split among the three junctions 101, 102, 103. The branching paths include two loops 105, 106, and flux from a control path 107 is linked to the two loops so that the control current $I_c$ controls the gated current $I_G$. Each of the two loops 105, 106 may include a respective resistor 107, 108 for damping a resonance condition in each of the loops. As shown in FIG. 6B, the switching characteristic may more closely approximate the ideal switching characteristic of FIG. 3B. In most cases, however, the two-junction gate 91 in FIG. 5A is preferred over the three-junction gate 100 in FIG. 6A due to the relative simplicity of the two-junction gate. Moreover, the two-junction gate 91 of FIG. 5A can be combined in various other ways with an additional Josephson junction, as described below with reference to FIG. 13, to obtain more discriminating switching characteristics.

Figure 7:
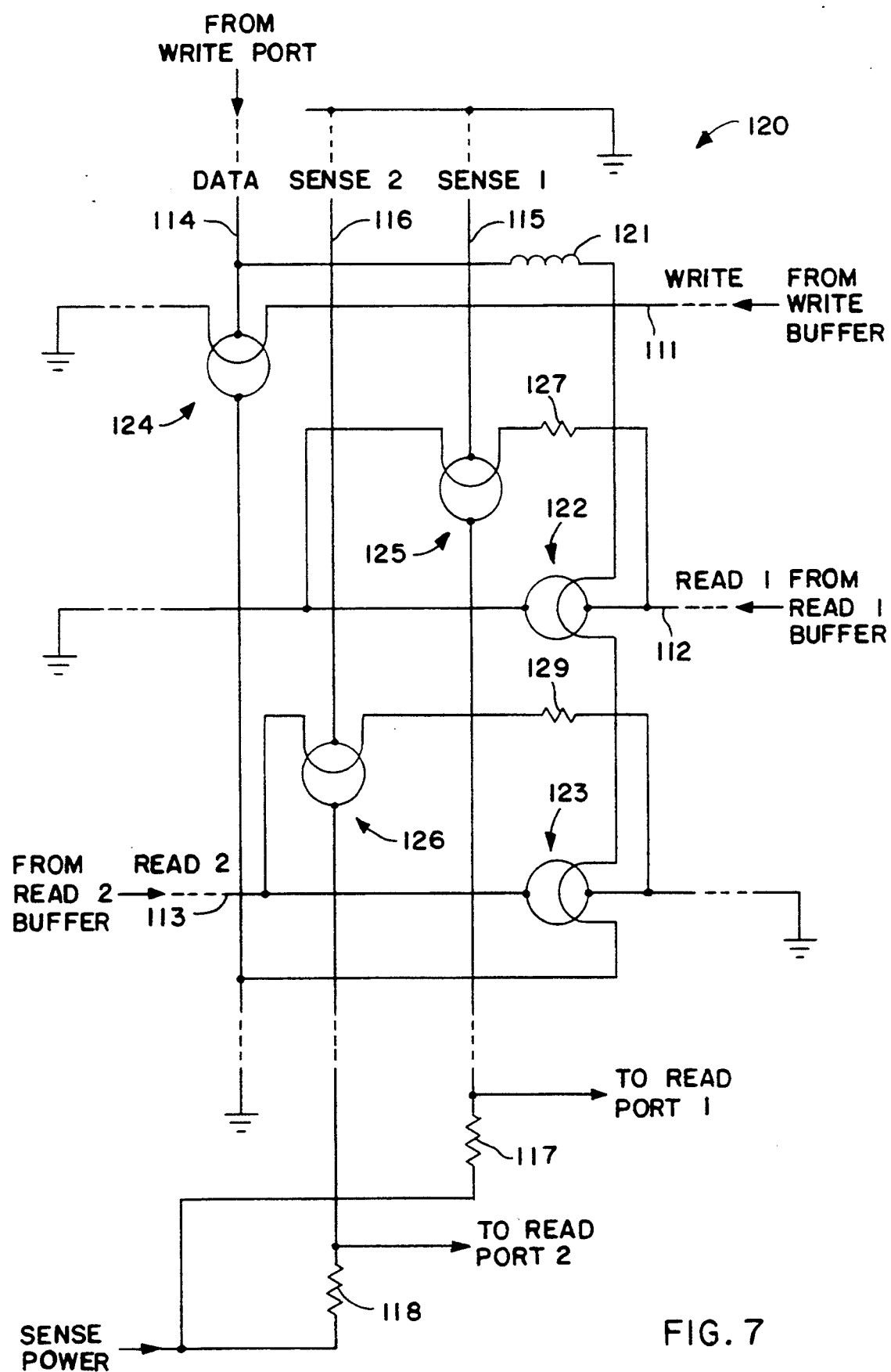
FIG. 7 is a schematic diagram of a first embodiment of the three-port memory cell in accordance with the present invention.

Turning now to FIG. 7, there is shown a schematic diagram of a three-port memory cell 120 in accordance with a first embodiment of the present invention. The cell 120 is disposed in a row of cells threaded by a write line 111 from the write buffer (66 in FIG. 2), a first read line 112 from the first read buffer (66 in FIG. 2), and a second read line 113 from the second read buffer (68 in FIG. 2). The cell 120 is disposed in a column of cells threaded by a data line 114 from the write port (61 in FIG. 2), a first sense line 115, and a second sense line 116. A lower end of the first sense line 115 is connected to a line of the first read port (62 in FIG. 2). A lower end of the second sense line 116 is connected to a line of the second read port (63 in FIG. 2).

A bit of stored information is encoded into the presence or absence of a persistent current flowing in a clockwise direction in a storage loop. The storage loop has a total inductance, represented by an inductor 121, of about 32 pH to store about four flux quanta of magnetic flux in the storage loop. The storage loop includes the control current paths for a first read gate 122 and a second read gate 123, and the gated current path for a write gate 124.

To write data into the storage loop, a pulse of current is transmitted through the write line 111, which includes the control current path for the write gate 124. The pulse of current causes the write gate 124 to switch "off" to a resistive state for an amount of time sufficient for any persistent current in the storage loop to decay to substantially zero when a logic 0 is written into the cell. The persistent current, for example, decays to substantially zero when the flux in the storage loop decays to less than one-half of a flux quanta, so that zero flux quanta would remain in the storage loop when the pulse of current is removed from the write line 111. Either a logic 0 or logic 1 is written into the cell 120, depending on whether or not current is flowing in the data line 114 when the pulse of current is applied to the write line 111. In the absence of current flowing in the data line 114, a logic 0 is written into the cell. When current is flowing in the data line, however, the current in the data line 114 is diverted into the storage loop when the pulse of current is applied to the write line 111 and the write gate 124 switches "off", and the diverted current becomes trapped in the storage loop when the pulse of current is removed from the write line and the write gate 124 switches "on".

Each row of memory cells in the memory cell array (60 of FIG. 2) corresponds to a single one of the registers in the register file (11 in FIG. 2). Therefore, there is no "half select" problem during a write operation, because all of the cells in a particular row are selected simultaneously by a pulse on the write line 111. So that there is not a "half select" problem for reading data from the cell 120, the first read gate 122 has a corresponding buffer gate 125, and the second read gate 123 has a corresponding buffer gate 126.

To read data from the cell 120 and to transmit the data read from the cell to the first read port (62 in FIG. 2), a pulse of current is applied to the first read line 112. The first read line 112 is connected to the gated current path of the first read gate 122.

When the data stored in the cell is a logical zero, a persistent circulating current is absent and therefore the first read gate 122 is in its "on" state when the pulse is applied to the first read line 129. In this case, there is essentially no voltage drop across the first read gate due to the pulse of current through the first read line 129. The first buffer gate 127 has its control current line connected in series with a resistor 127 so as to provide a control current proportional to the voltage drop across the first read gate 122. The first sense line 131 is in the gate current path for the first buffer gate 127. Therefore, when a logical zero is stored in the cell 120 and a pulse of current is sent through the first read line 112, the first buffer gate 125 will remain in its "on" state. Moreover, all of the first buffer gates in other cells in the same column as the cell 120 will also remain in their "on" states because none of these other cells will have pulses of current through their first read lines. Consequently, a logical zero will result at the lower end of the first sense line 115 when "sense power" is applied to the first sense line through a resistor 128.

When a logical one is stored in the cell 120 and a pulse of current is sent through the first read line 112, the first read gate 122 switches to its "on" state, and the pulse of current through the first read line 112 is diverted to flow through the resistor 127 and the control current path of the first buffer gate 125. Therefore first buffer gate 125 switches to its "off" state, causing a voltage to appear at the lower end of the first sense line 115 when sense power is applied through the resistor 117. This reading of data from the cell 120 is entirely non-destructive.

In a similar fashion, the current control line of the second buffer gate 126 is connected in series with a resistor 129 across the second read gate 123 so that the state of the second buffer gate 126 is responsive to the information stored in the memory cell 120 when the memory cell 120 is selected by a pulse of current on the second read line 113. The second sense line 116 includes the gate current path for the second buffer gate 126. Therefore, when a current pulse is applied to the second read line 113 and sense power is applied through a resistor 118 to the second sense line 116, the voltage on the lower end of the second sense line will indicate the logic state of the stored information in the cell 120.

Figure 8:
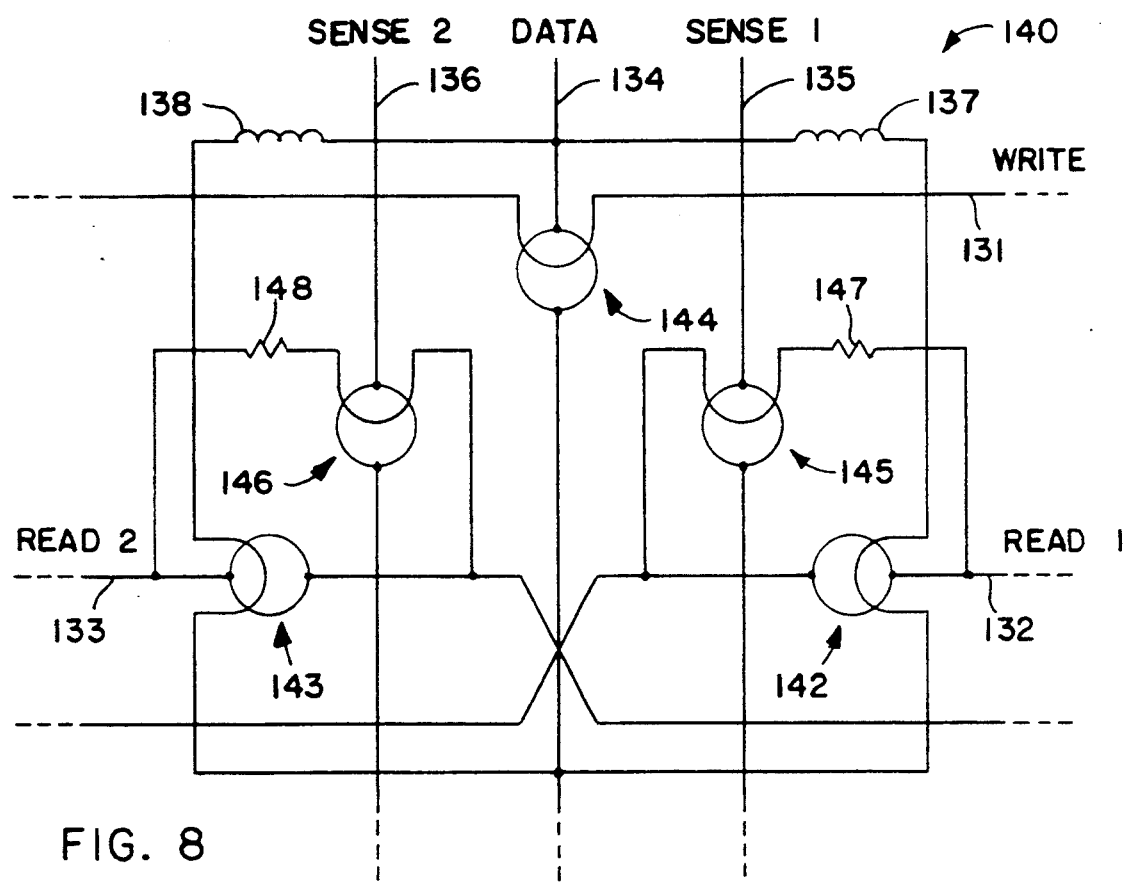
FIG. 8 is a schematic diagram of a preferred embodiment of the three-port memory cell according to the present invention.

Turning now to FIG. 8, there is shown a schematic diagram of a three-port memory cell 140 according to a preferred embodiment of the present invention. Although the cell 140 in FIG. 8 has a more complex topology than the memory cell 120 of FIG. 7, the cell 140 in FIG. 8 requires less circuit area and has better margins. When the same layout rules were used for each circuit (minimum line width of 2 $\mu$m and minimum junction size of 3.75 $\mu$m), the cell 140 of FIG. 8 required a cell size of 52 $\mu$m $\times$ 80 $\mu$m, and the cell 120 of FIG. 7 required a cell size of 58 $\mu$m $\times$ 76 $\mu$m. This is estimated to be a 20% savings in circuit area for the cell 140 in FIG. 8 compared to two three-gate dual-port memory cells, and a 15% savings in circuit area for the cell 120 in FIG. 7 compared to two three-gate dual-port memory cells.

The cell 140 of FIG. 8 is located at the intersection of a write line 131, a first read line 132, a second read line 133, and a data line 134, a first sense line 135, and a second sense line 136. The cell 140 of FIG. 8 also has a first read gate 142, a second read gate 143, a write gate 144, a first buffer gate 145, and a second buffer gate 146. The first buffer gate 145 has its control current path connected in series with a resistor 147 and in parallel across the gated current path of the first read gate 142. The second buffer gate 146 has its control current path connected in series with a resistor 148 and in parallel across the gated current path of the second read gate 143. In these respects, the memory cell 140 of FIG. 8 is similar to the memory cell 120 of FIG. 7. The memory cell 140 of FIG. 8, however, has two independent flux storage loops. The first flux storage loop has a total inductance represented by an inductor 137, and the first flux storage loop includes the control current path of the first read gate 142, and the gated current path of the write gate 144. The second flux storage loop includes the control current path of the second read gate 143, and the gated current path of the write gate 146. Preferably each of the two flux storage loops has a total inductance of about 23 pH to store three flux quanta in each loop. A logic 0 is represented as no circulating current in either of the two flux storage loops. A logic 1 is represented as a persistent clockwise circulating current in one of the two flux storage loops, and a persistent counter-clockwise circulating current in the other of the two flux storage loops.

Figure 9:
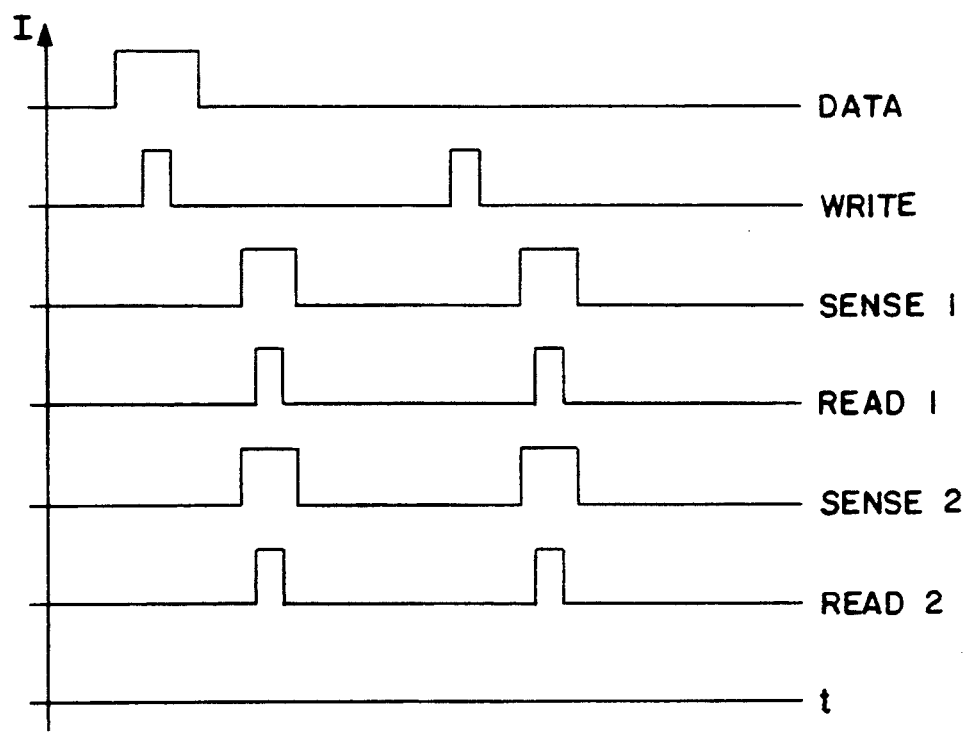
FIG. 9 is a timing diagram showing traces of the control signals that control the three-port memory cell of FIG. 7 or FIG. 8.

Preferably read and write operations for the memory cell 140 in FIG. 8 use unipolar control signals, as shown in FIG. 9. The control signals in FIG. 9, for example, perform a write operation of a logic one, followed by a read operation, followed by a write operation of a logic zero, followed by another read operation. Similar control signals could be used for accessing the memory cell 120 of FIG. 7.

The write operation is performed by first injecting a current pulse into the data line 134 if a logic "1" is to be written into the memory cell 140 in FIG. 8. Another pulse of current (of narrower width) is simultaneously applied to the write line 131 to select the write gate 144. As shown in FIG. 9, the write enable pulse should vanish before the data line pulse drops. Two circulating currents representing the logic "1" are then stored in the two independent storage loops in the cell 140 of FIG. 8. The operation for writing a logic "0" is similar except that the data line 134 is not activated, no circulating currents are stored in the storage loops, and any prior circulating currents are quenched by the opening of the write gate 144.

The read operation of the contents of the first storage loop is performed by injecting current into the first sense line 135. Then a pulse of current is applied to the first read line 132. If a circulating current is stored in the first storage loop (which includes the control current path for the first read gate 142), then the first read gate 142 will switch to its "off" state and divert the current in the first read line 132 through the resistor 147 and the control current path of the first buffer gate 145. The resistor 147 prevents the current in the first read line 132 from flowing through the control current path of the first buffer gate 145 when the first read gate 142 is in its "on" state. When the current in the first read line 132 is diverted to flow through the control current path of the first buffer gate 145, the first buffer gate switches from its "on" state to its "off" state. Therefore the presence of the circulating current in the first storage loop is indicated by a voltage across the gated current path of the first buffer gate, and this voltage appears at an end of the first sense line 135. On the other hand, if there is an absence of a circulating current in the first storage loop during the application of current to the first sense line and a pulse of current to the first read line, the first read gate 142 and the first buffer gate 145 will remain in their "on" states and no voltage will appear at the end of the first sense line 135.

The read operation of the contents of the second storage loop is performed in a manner similar to that described above for reading the contents of the first storage loop. The presence or absence of a circulating current in the second storage loop is indicated by the presence or absence of a voltage at the end of the second sense line 136 during the application of current to the second sense line and a pulse of current to the second read line 133.

Figure 10:
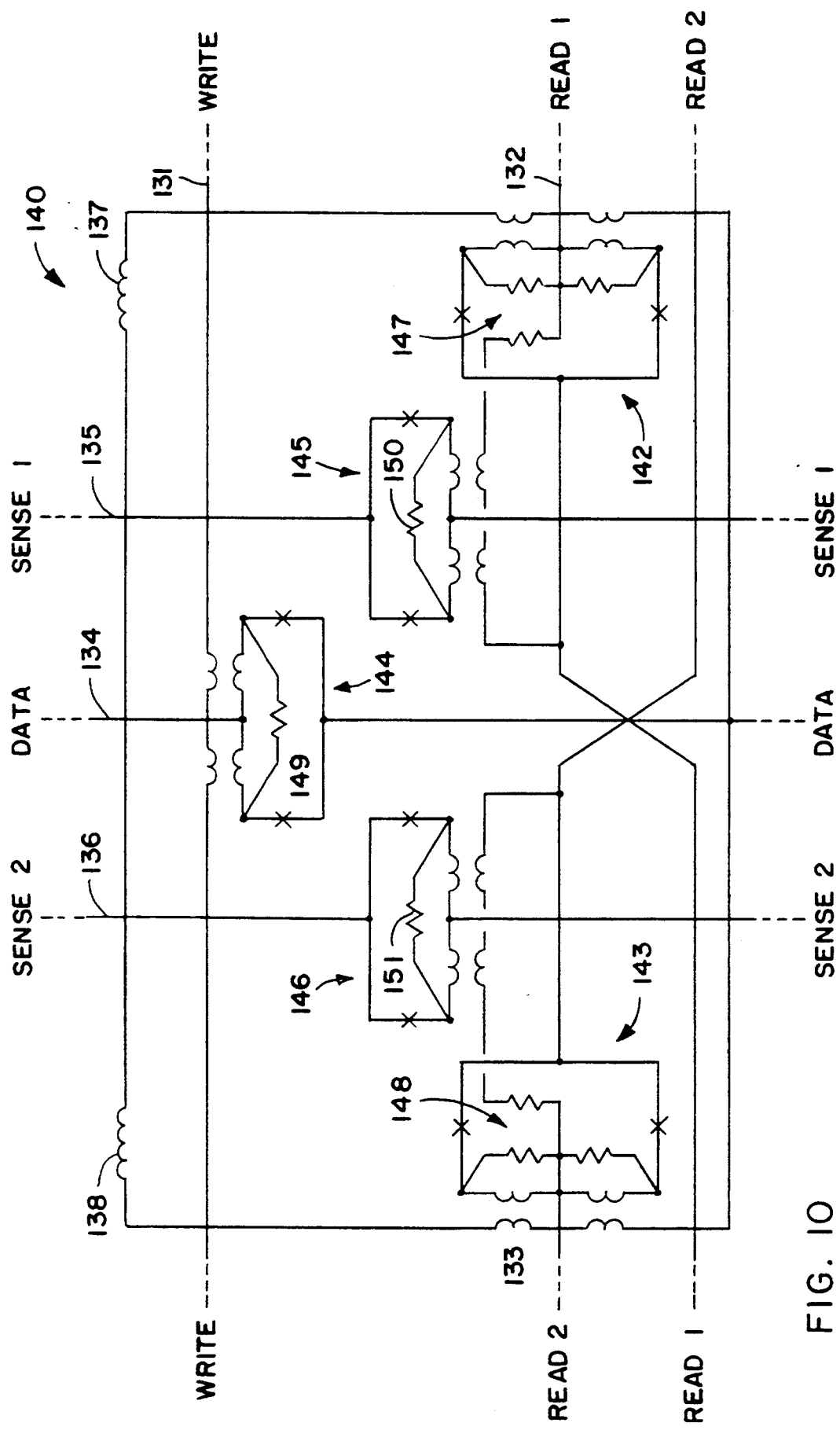
FIG. 10 is a schematic diagram of the preferred circuitry for the three-port memory cell in accordance with the preferred embodiment of FIG. 8.

Turning now to FIG. 10, there is shown a more detailed schematic diagram of the preferred three-port memory cell 140. The write gate 144, the first buffer gate 145, and the second buffer gate 146 are symmetric two-junction Josephson gates, also known as superconducting quantum interference devices (SQUIDs), each having a mutual inductance of about 4 pH, and a critical current of about 0.4 mA. The first read gate 142 and the second read gate 143 are asymmetric two-junction SQUIDs each having a 1:3 junction critical current ratio and having a total critical current of about 0.4 mA and mutual inductance of about 4 pH. The resistors 147 and 148 each present a resistance of about 0.5 ohms to the flow of control current through the first buffer gate 145 and the second buffer gate 146, respectively. The resistors 147 and 148 are also configured to provide a damping resistance of about 1 to 2 ohms across the loop circuits of the first read gate 142 and the second read gate 143, respectively. Each of the other gates 144, 145, 146 also has a respective damping resistor 149, 150, 151 of about 1 to 2 ohms.

The single storage loop memory cell 120 of FIG. 7 may use components similar to the components used for the dual storage loop memory cell 140 of FIG. 8. The write gate 124, the first buffer gate 125, and the second buffer gate 126 preferably are symmetric two-junction SQUIDs, each having a mutual inductance of about 4 pH, and a critical current of about 0.4 mA. The first read gate 122 and the second read gate 123 preferably are asymmetric SQUIDs each having a 1:3 junction critical current ratio and having a total critical current of about 0.4 mA and mutual inductance of about 4 pH.

Figure 11:
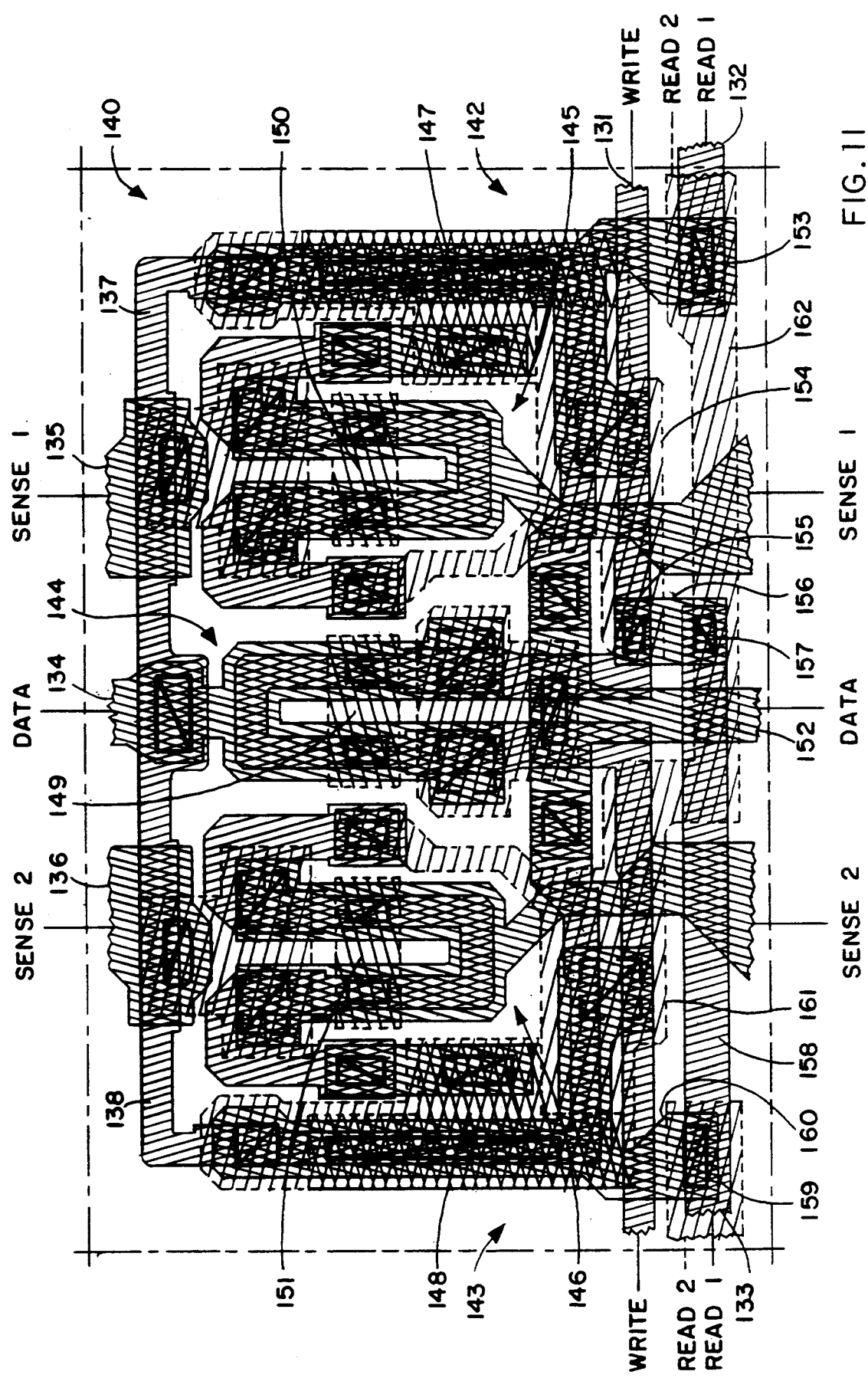
FIG. 11 is a plan view of the preferred construction of the three-port memory cell in accordance with the preferred embodiment of FIG. 8.

Turning now to FIG. 11, there is shown a composite plot of the preferred layout of the dual-loop memory cell 140 corresponding to the preferred circuit of FIG. 10. The preferred layout has a minimum line width of 2 μm and a minimum junction size of 3.75 μm. The cell 140 in FIG. 11 has overall dimensions of 52 μm×80 μm. The layout assumes a junction critical current density of 1 KA/cm².

Figure 12:
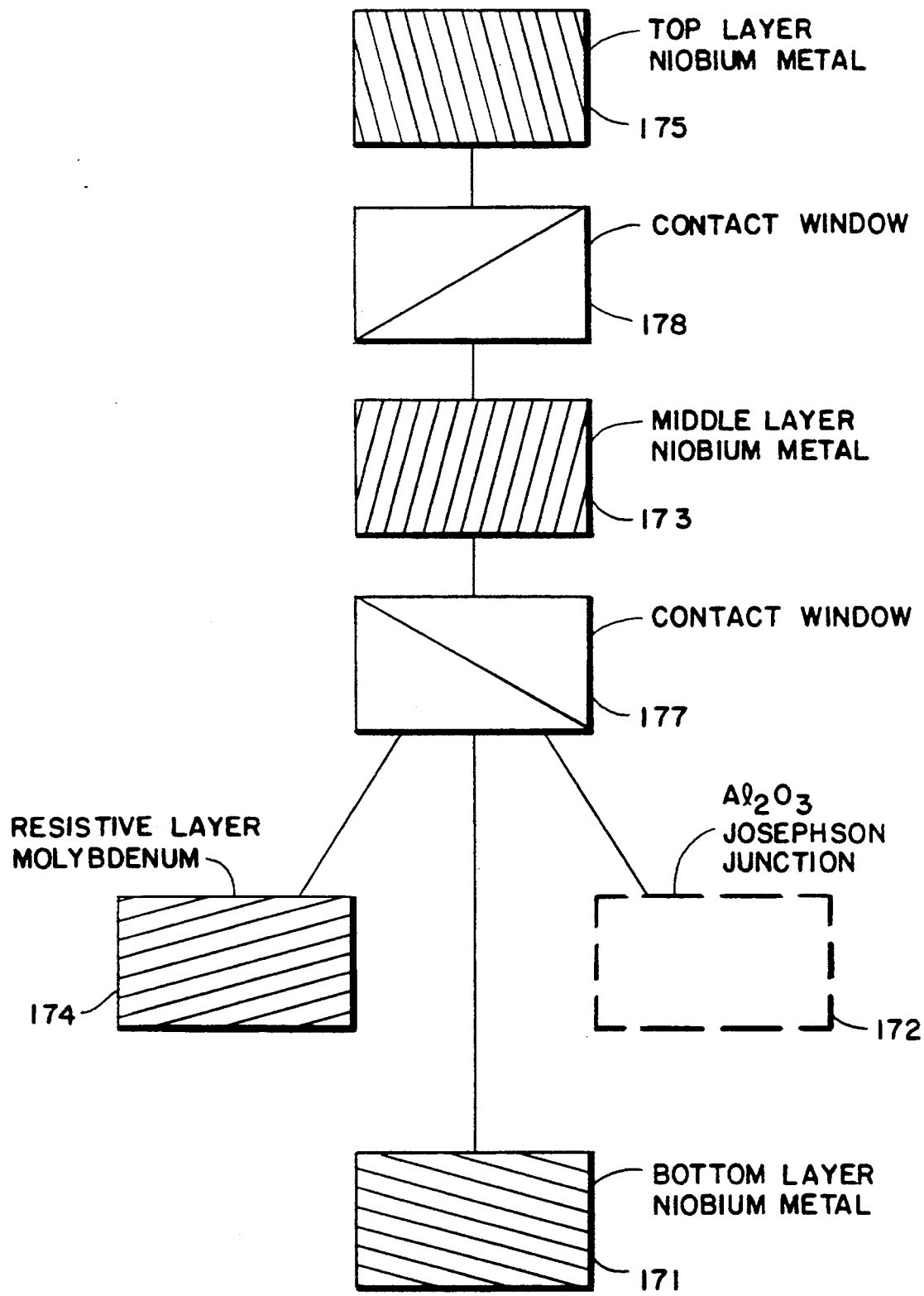
FIG. 12 is a diagram showing the symbols for the various layers of material and junctions in the plan view of FIG. 11.

The symbols for the various layers and junctions in the layout of FIG. 11 are shown in FIG. 12. Not shown in FIG. 11 or FIG. 12 are a silicon wafer substrate, a niobium metal film ground plane layer, and a silicon dioxide insulating layer on the ground plane layer. The layers shown in FIGS. 11 and 12 include a bottom layer of niobium metal film (171 in FIG. 12), an aluminum oxide ($Al_2O_3$) Josephson junction layer (172 in FIG. 13), a middle layer of niobium metal film (173), a resistive layer of molybdenum metal film (174 in FIG. 12), and a top layer of niobium metal film (175). Not shown in FIGS. 11 or 12 are silicon dioxide insulating layers between the niobium and molybdenum metal film layers 171, 173, 174, and 175. Shown in FIGS. 11 and 12, however, are contact windows in the silicon dioxide insulating layers that provide connections between the niobium and molybdenum metal film layers. The contact windows include a window 176 for a connection between the bottom layer of niobium metal film 171 and the middle layer of niobium metal film 173, a contact window 177 for a connection between the middle layer of niobium metal film 173 and the resistive layer of molybdenum metal film 174, and a contact window 178 for a connection between the middle layer of niobium metal film 173 and the top layer of niobium metal film 175.

As shown in FIG. 11, the control current path of each of the gates 142, 143, 144, 145, 146 is formed in the top layer of niobium metal film. The gated current path of each of the gates 142, 143, 144, 145, 146 is formed in the middle and bottom layers of the niobium metal film. The write line 131 is a continuous narrow strip of top-layer niobium metal film that loops over the write gate 144.

The first storage loop including the inductance 137 includes top-layer niobium metal film that loops clockwise around and through the upper control current path of the first write gate 142, is joined by a T-shaped pattern 152 of middle-layer niobium metal film providing a lower extension of the data line, and loops upward through the gated current path of the write gate 144. The second storage loop including the inductance 138 includes top-layer niobium metal film that loops counter-clockwise around and through the upper control current path of the second write gate 143, is joined by the T-shaped pattern 152 of middle-layer niobium metal film, and loops upward through the gated current path of the write gate 144.

The first read enable line 132 and the second read enable line 133 cross over each other when passing through the cell 40. Extending from left to right, the first read line 132 begins on the top layer of niobium metal film, and passes downward through a contact window 153 to a pattern of middle-layer niobium metal film providing the gated current path for the first read gate 142. The first read enable line continues along the bottom niobium metal film pattern 154 of the gated current path of the first read gate 142 and upward through a contact window 155 to a pattern 156 of middle-layer Niobium metal film, and again upward through another contact window 157 to a strip 158 of top-layer niobium metal film. Extending from right to left, the second read enable line 133 begins on the bottom layer of niobium metal film, and passes upward through a contact window 159 to a pattern 160 of middle layer metal film providing the gated current path for the second read gate 143. The second read enable line continues along the bottom layer of niobium metal film pattern 161 of the gated current path of the second read gate which extends along an elongated portion 162 to the right-hand side of the cell 140.

Ten chips with a 4×4 array of cells and a single cell of the design in FIG. 11 were fabricated and tested. Their measured margins for the data, write, read 1, read 2, sense 1, and sense 2 control signals were +/−17%, >+/−80%, +/−17%, +/−7%, +/−62%, and +/−62%, respectively, when the other signals were held at nominal values. Six of these ten chips were tested with a common sense bias applied through resistors of 50 ohms to each sense line. (See the resistors 117 and 118 in FIG. 7.) The margin for this common sense bias was +/−40%. The term "margin" is a measurement of how wide a signal level can be changed, or how wide the operating range is for a signal. "Margin" is defined by +/− (maximum bias condition—minimum bias condition)/(maximum bias condition+minimum bias condition). This definition is equivalent to +/− half of the range of operation divided by the center of the range of operation.

Two chips with a 4×4 array and a single cell of the circuit in FIG. 7 were fabricated. These single-loop cells used two-junction SQUID gates, component values, and layout rules similar to the gates, component values and layout rules used for the ten chips of dual-loop cells. The cell size for the single-loop cells was 58 μm×76 μm. The measured margins for the data, write, read 1, read 2, sense 1, and sense 2 control signals of the single-loop cells were +/−7%, +/−63%, +/−8%, +/−5%, +/−60%, and +/−47%, respectively, when the other signals were held at nominal values.

Figure 13:
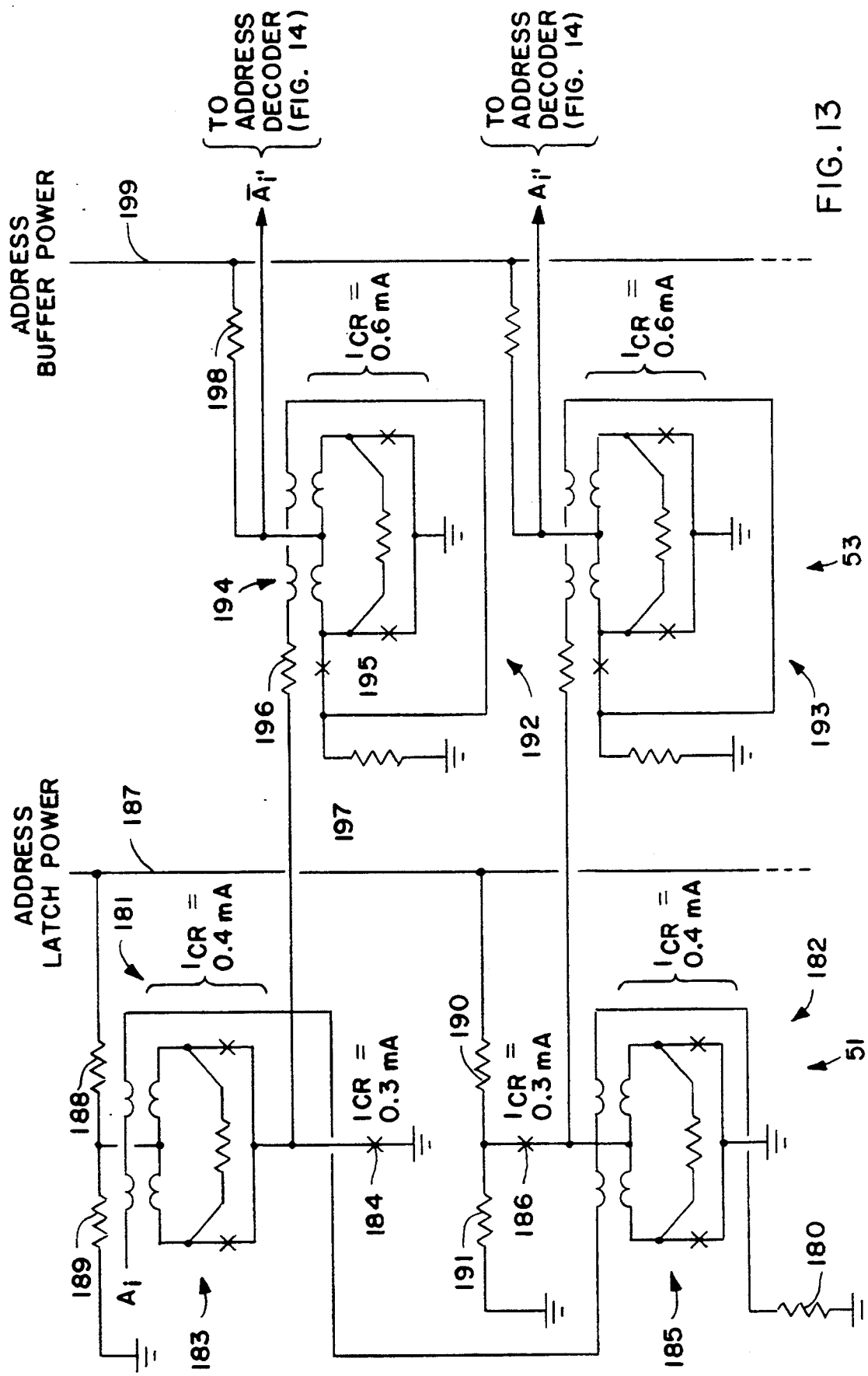
FIG. 13 is a schematic diagram of the preferred circuitry for the address latches and the address buffers used in the register file of FIG. 2.

Turning now to FIG. 13, there is shown a schematic diagram for the Josephson gates and circuits in the address latch 51 and the address buffer 53 introduced in FIG. 2. The gates and circuits shown in FIG. 13 include only the gates and circuits for a particular bit $A_i$ of the register address. For the bit $A_i$, the address latch 51 includes a timed inverting gate 181, and a timed non-inverting gate 182. The inverting gate 181 includes a two-junction SQUID in series with a Josephson junction 184. The non-inverting gate 182 also includes a two-junction SQUID 185 and a Josephson junction 186. The current control paths of the two gates 181, 182 are connected in series, and terminated with a resistor 180, which has a value of about 20 ohms. The gates 181 and 182 are powered from a common address latch power line 187 connected to the gates 181 and 182 through resistive voltage dividers including resistors 188, 189, 190, and 191. The resistors 188 and 190, for example, each have a value of about 9 ohms, and the resistors 189 and 191 each have a value of about 3 ohms. The SQUIDs each have a total critical current of about 0.4 mA, and the Josephson junctions 184, 186 each have a critical current of about 0.3 mA, so that the gates 181, 182 sample and hold logic levels of the input $A_i$ when a voltage is applied to the latch power line 187.

For the register address bit $A_i$, the address buffer 53 includes a pair of MVTL gates 192 and 193. The MVTL gate 192 includes a two-junction SQUID 194, a Josephson junction 195, a 5 ohm input resistor 196, a 1.5 ohm isolation resistor 197, and a 35 ohm pull-up resistor 198 coupling the SQUID 194 to an address buffer power line 199. The SQUID 194 has a total critical current of about 0.6 mA. The MVTL gate 193 has a construction similar to the MVTL gate 192. The output of the MVTL gate 192 is a complement of the address input bit $A_i$, and the MVTL gate 193 has an output providing a buffered version $A_i'$ of the address input bit $A_i$.

Figure 14:
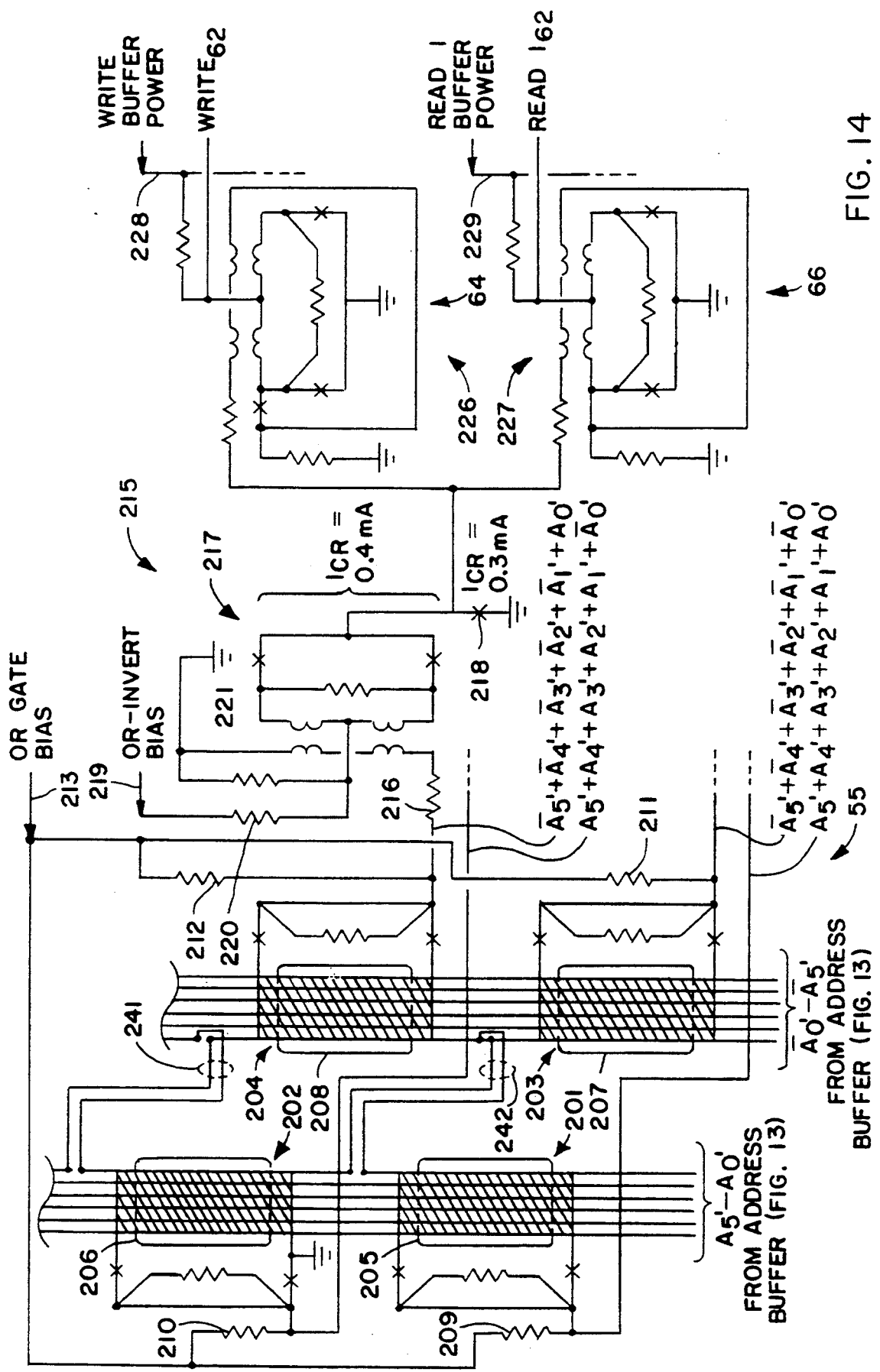
FIG. 14 is a schematic diagram of the preferred circuitry for the address decoders and read and write buffers used in the register file of FIG. 2.

Turning now to FIG. 14, there is shown a schematic diagram of the address decoder 55, and gates in the write buffer 64 and first read buffer 66 for providing write enable and first read enable signals for a register address of 62 decimal. The address decoder 55 receives true and complement address bits $A_i'$ from the address buffer 53 in FIGS. 2 and 13.

The address decoder 55 includes a pair of columns of OR gates 201, 202, 203, 204. Although only two gates are shown in each column in FIG. 14, for a register file having six address bits providing 64 different register addresses, each column of OR gates would include 32 OR gates. Each of the OR gates 201, 202, 203, 204 is a two-junction SQUID having six independent current control paths. The circuit loop including the two Josephson junctions in each SQUID includes a wide metal film link to six independent current control paths which are laid over the link. The wide links are cross-hatched in FIG. 14. The current control paths are provided by address busses in the top layer of niobium metal film. To increase the coupling between lines in each address bus and the wide strip of metal film in each SQUID, the wide strip of metal film for each gate 201, 202, 203, 204 is registered with a respective hole 205, 206, 207, 208 in the lower-most niobium metal film ground plane layer. The output of the SQUID for each OR gate 201, 202, 203, 204 is connected through a respective resistor 209, 210, 211, 212 to an OR gate bias line 213. The resistors 209, 210, 211, 212 each have a resistance of about 26 ohms. Each OR gate 201, 202, 203, 204 provides a logic zero output in response to a particular register address.

Neighboring OR gates in each column respond to a different register address in a Gray-code sequence. This Gray-code sequence is a consequence of minimizing the number of vias required in connecting each of the OR gates 201, 202, 203, 204 to a different combination of true and complement address lines. As shown in FIG. 14, the different combinations of true and complement address lines are obtained by a cross connection (241, 242) between the two columns of address lines for a particular address bit and for each pair of neighboring OR gates in each column of OR gates. The OR gates are spaced and staggered from each other to reduce parasitic coupling of the current control paths from one gate to the SQUID circuit loop of the other OR gates.

The address decoder 55 includes a timed inverter generally designated 215 for each of the OR gates 201, 202, 203, 204. The timed inverter 215 is coupled via a series resistor 216 of about 5 ohms to the output of the OR gate 204. The timed inverter 215 includes a two-junction SQUID 217 having a critical current of about 0.4 mA, and a Josephson junction 218 having a critical current of about 0.3 mA. The timed inverter 215 receives power from an OR-invert bias line 219 and a voltage divider including a series resistor 220 of about 9 ohms and a shunt resistor 221 of about 3 ohms. The output of the timed inverter 215 is received by a respective MVTL gate 226 in the write buffer 64, and a respective MVTL gate 227 in the first read buffer 66. The MVTL gate 226 in the write buffer 64 of FIG. 14 receives power from a write buffer power line 228. The MVTL gate 227 in the first read buffer 66 of FIG. 14 receives power from a first read buffer power line 229. The MVTL gates 226 and 227 each have a construction and component values similar to the construction and component values described above for the MVTL gate 192 in the address buffer 53 in FIG. 13.

In view of the above, there has been described a non-destructive readout Josephson memory cell with a single write gate and two buffered independent sense gates, using only five gates. The memory cells can be used to construct a register file in which an entire row of cells is accessed simultaneously, and in which the "half select" problem is eliminated for both reading and writing. The preferred cell construction has two current storage loops, relatively wide operating margins, and a savings of about 20% of the circuit area that would be required if two dual-port memory cells were connected in parallel to construct a three-port memory cell.

What is claimed is:

1. A method of storing data in a superconducting memory cell and retrieving the stored data, said memory call receiving a data input signal from a data line, a write enable signal from a write line, a first read enable signal from a first read line, and a second read enable signal from a second read line, said memory cell transmitting a first data output signal to a first sense line and a second data output signal to a second sense line, said method comprising the steps of:

opening a write gate in response to said write enable signal being received from said write line to divert and store said data input signal as a circulating current in said memory cell;

sensing said circulating current with a first read gate to generate said first data output signal, and transmitting said first data output signal from said memory cell to said first sense line in response to said first read enable signal; and sensing said circulating current with a second read gate to generate said second data output signal, and independently transmitting said second data output signal from said memory cell to said second sense line in response to said second read enable signal, so that said circulating current can be sensed independently or simultaneously on said first sense line or said second sense line.

2. The method as claimed in claim 1, wherein said circulating current flows in series through a gated current path of said write gate, a control current path of said first read gate, and a control current path of said second read gate so that said circulating current is circulated in a single loop.

3. The method as claimed in claim 1, wherein a first portion of said circulating current flows in a first loop including a gated current path of said write gate and a control current path of said first read gate, and a second portion of said circulating current flows in a second loop including said gated current path of said write gate and a control current path of said second read gate.

4. The method as claimed in claim 1, wherein said first data output signal is transmitted from said memory cell to said first sense line by a first buffer gate in response to said first read enable signal being diverted by said first read gate to said first buffer gate when said circulating current is present; and wherein said second data output signal is transmitted from said memory cell to said second sense line by a second buffer gate in response to said second read enable signal being diverted by said second read gate to said second buffer gate said when said circulating current is present.

5. A superconducting memory cell, said memory cell receiving a data input signal from a data line, a write enable signal from a write line, a first read enable signal from a first read line, and a second read enable signal from a second read line, said memory cell transmitting a first data output signal to a first sense line and a second data output signal to a second sense line, said superconducting memory cell comprising a plurality of Josephson gates, said Josephson gates including:

a write gate having a control current path connected to said write line for receiving said write enable signal, and a gated current path connected to said data line for receiving said data input signal and storing said data input signal as circulating current in response to said write enable signal;

a first read gate having a control current path connected to the gated current path of said write gate for sensing said circulating current to generate said first data output signal, said first read gate having a gated current path connected to said first read line and said first sense line for transmitting said first data output signal from said memory cell to said first sense line in response to said first read enable signal; and a second read gate having a control current path connected to the gated current path of said write gate for sensing said circulating current to generate said second data output signal, said second read gate being connected to said second read line and said second sense line for transmitting said second data signal from said memory cell to said second sense line in response to said second read enable signal.

6. The superconducting memory cell as claimed in claim 5, wherein the gated current path of said write gate, the control current path of said first read gate, and the control current path of said second read gate are connected in series to form a single loop for conducting said circulating current.

7. The superconducting memory cell as claimed in claim 5, wherein the gated current path of said write gate, the control current path of said first read gate, and the control current path of said second read gate are connected in parallel to form two loops for conducting said circulating current.

8. The superconducting memory cell as claimed in claim 7, wherein said cell is formed on a planar substrate, and said circulating current circulates in a clockwise direction in one of said two loops and circulates in a counter-clockwise direction in the other of said two loops.

9. The superconducting memory cell as claimed in claim 5, wherein said write gate, said first read gate, and said second read gate are two-junction superconducting quantum interference devices (SQUIDs).

10. A superconducting memory cell, said memory cell receiving a data input signal from a data line, a write enable signal from a write line, a first read enable signal from a first read line, and a second read enable signal from a second read line, said memory cell transmitting a first data output signal to a first sense line and a second data output signal to a second sense line, said superconducting memory cell comprising a plurality of Josephson gates, said Josephson gates including:

a write gate having a control current path connected to said write line for receiving said write enable signal, and a gated current path connected to said data line for receiving said data input signal and storing said data input signal as circulating current in response to said write enable signal;

a first read gate having a control current path connected to the gated current path of said write gate for sensing said circulating current, said first read gate having a gated current path connected to said first read line for receiving said first read enable signal and diverting said first read enable signal when said circulating current is present;

a first buffer gate having a control current path connected to the gated current path of said first read gate for receiving said first read enable signal diverted from said gated current path of said first read gate when said circulating current is present, said first buffer gate having a gated current path connected to said first sense line for transmitting said first data output signal from said memory cell to said first sense line when said first read enable signal is diverted from said gated current path of said first read gate;

a second read gate having a control current path connected to the gated current path of said write gate for sensing said circulating current, said second read gate having a gated current path connected to said second read line for receiving said second read enable signal and diverting said second read enable signal when said circulating current is present; and a second buffer gate having a control current path connected to the gated current path of said second read gate for receiving said second read enable signal diverted from said gated current path of said second read gate when said circulating current is present, said second buffer gate having a gated current path connected to said second sense line for transmitting said second data output signal from said memory cell to said second sense line when said second read enable signal is diverted from said gated current path of said second read gate.

11. The superconducting memory cell as claimed in claim 10, wherein the gated current path of said write gate, the control current path of said first read gate, and the control current path of said second read gate are connected in series to form a single loop for conducting said circulating current.

12. The superconducting memory cell as claimed in claim 10, wherein the gated current path of said write gate, the control current path of said first read gate, and the control current path of said second read gate are connected in parallel to form two loops for conducting said circulating current.

13. The superconducting memory cell as claimed in claim 12, wherein said cell is formed on a planar substrate, and said circulating current circulates in a clockwise direction in one of said two loops and circulates in a counter-clockwise direction in the other of said two loops.

14. The superconducting memory cell as claimed in claim 10, further comprising a first resistor and a second resistor; wherein said first resistor, the gate current path of said first read gate, and the control current path of said first buffer gate are connected in series; and wherein said second resistor, the gated current path of said second read gate, and the control current path of said second buffer gate are connected in series.

15. The superconducting memory cell as claimed in claim 10, wherein said write gate, said first read gate, said second read gate, said first buffer gate, and said second buffer gate are two-junction superconducting quantum interference devices (SQUIDs).

16. The superconducting memory cell as claimed in claim 15, wherein said write gate, said first buffer gate, and said second buffer gate are symmetric SQUIDs; and wherein said first read gate and said first write gate are asymmetric SQUIDs.

17. The superconducting memory cell as claimed in claim 10, wherein said memory cell is included in a row of memory cells threaded by said write line, said first read line, and said second read line; and wherein said memory cell is included in a column of memory cells threaded by said data line, said first sense line, and said second sense line.

18. The superconducting memory cell as claimed in claim 17, wherein said write line is connected in series with the control current path of said write gate, said first read line is connected in series with the gated current path of said first read gate, said second read line is connected in series with the gated current path of said second read gate, said data line is connected in series with the control current path of said write gate, said first sense line is connected in series with the gated current path of said first buffer gate, and said second sense line is connected in series with the gated current path of said second buffer gate.

19. The superconducting memory cell as claimed in claim 10, wherein said cell includes no Josephson gates other than said write gate, said first read gate, said second read gate, said first buffer gate, and said second buffer gate.

* * * * *